United States Patent [19]

Panicker et al.

[11] Patent Number: 4,942,076

[45] Date of Patent: Jul. 17, 1990

[54] CERAMIC SUBSTRATE WITH METAL FILLED VIA HOLES FOR HYBRID MICROCIRCUITS AND METHOD OF MAKING THE SAME

[75] Inventors: Ramachandra M. P. Panicker, Camarillo; Anil K. Agarwal, Poway, both of Calif.

[73] Assignee: Micro Substrates, Inc., Camarillo, Calif.

[21] Appl. No.: 266,669

[22] Filed: Nov. 3, 1988

[51] Int. Cl.⁵ ............................................. B32B 3/00
[52] U.S. Cl. ................................. 428/137; 428/209; 428/210; 428/428; 428/432; 428/901
[58] Field of Search ............... 428/137, 209, 210, 428, 428/432, 901; 501/15, 17, 32; 106/1.05

[56] References Cited

U.S. PATENT DOCUMENTS

| | | | |
|---|---|---|---|
| 3,045,331 | 7/1962 | Ang et al. | 29/182 |
| 3,628,999 | 12/1971 | Schneble, Jr. et al. | 117/212 |
| 4,131,516 | 12/1978 | Bakos et al. | 427/97 |
| 4,394,712 | 7/1983 | Anthony | 361/411 |
| 4,435,611 | 3/1984 | Ohsawa et al. | 174/68.5 |
| 4,540,604 | 9/1985 | Siuta | 427/125 |
| 4,712,161 | 12/1987 | Pryor et al. | 361/411 |
| 4,732,780 | 3/1988 | Mitoff et al. | 204/15 |
| 4,788,523 | 11/1988 | Robbins | 338/203 |
| 4,835,039 | 5/1989 | Barringer et al. | 482/901 |

Primary Examiner—Patrick Ryan
Attorney, Agent, or Firm—John T. Matlago

[57] ABSTRACT

An as-fired alumina substrate for a hybrid microcircuit formed of GaAs dies operating at gigahertz frequencies has a large number of about 0.013" diameter via holes drilled on the surface thereof by use of a laser. A metal filling in each via hole is formed with about 85% sintered tungsten and 15% copper reflowed into the pores thereof to provide a composition that has a thermal coefficient of expansion that substantially matches that of the GaAs dies and the alumina substrate and also provides for hermetically sealing the via holes. The alumina substrate is further provided with a ground plane by which it is mounted on a metal block serving as a heat sink. The high frequency GaAs dies mounted on the via holes use the metal fillings therein to carry their internally generated heat to the heat sink and to provide low inductance ground paths for the microcircuit.

A process for placing the metal filling in the via holes makes use of a stencil having the same large number of via holes thereon as the alumina substrate for first squeegeeing a tungsten paste with a predetermined amount of binder into the via holes of the substrate. After the tungsten is sintered, the stencil is then used to squeegee a copper paste on the top of the sintered tungsten in the via holes. The copper in the paste is then reflowed into the pores of the sintered tungsten.

22 Claims, 3 Drawing Sheets

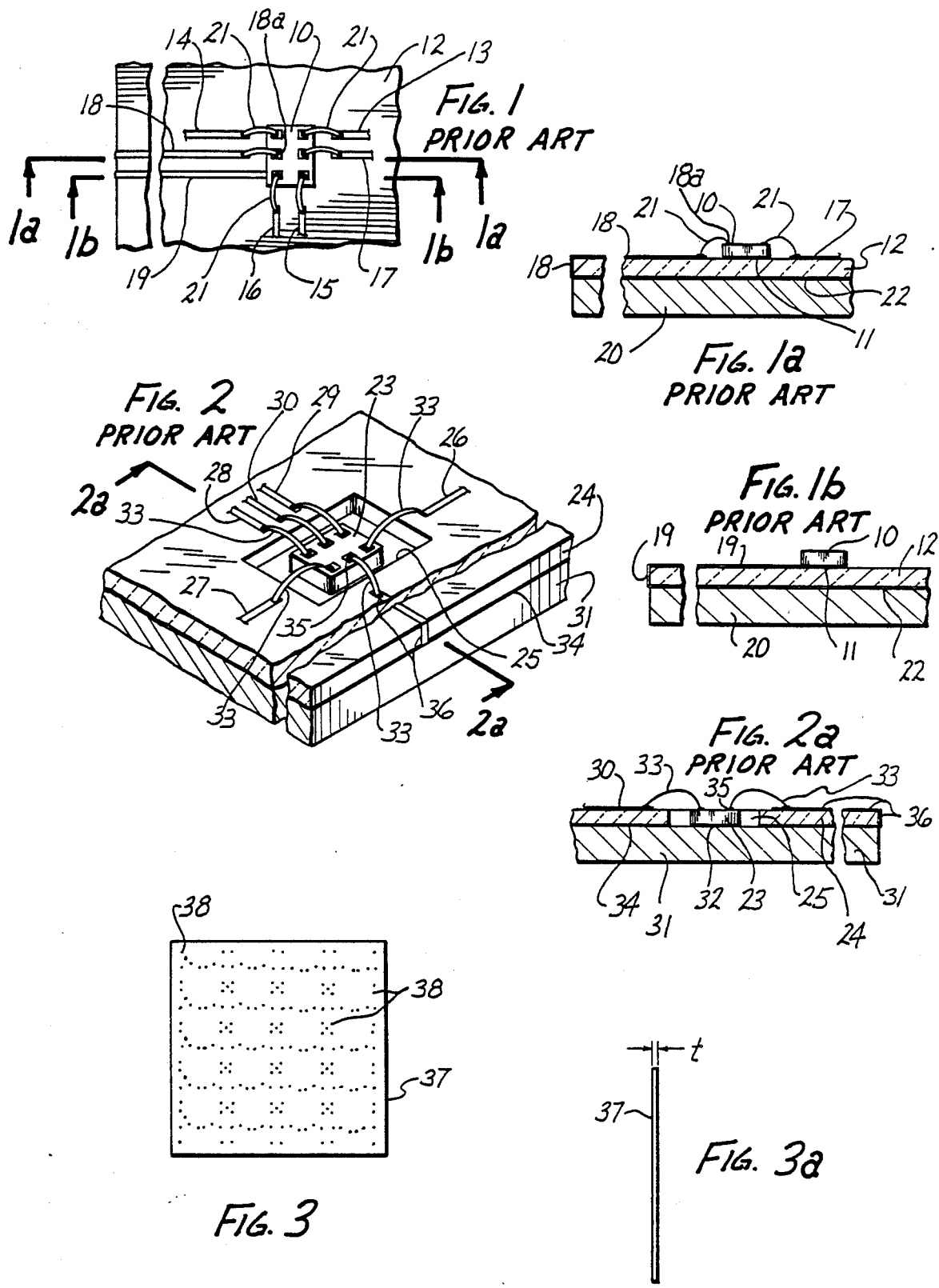

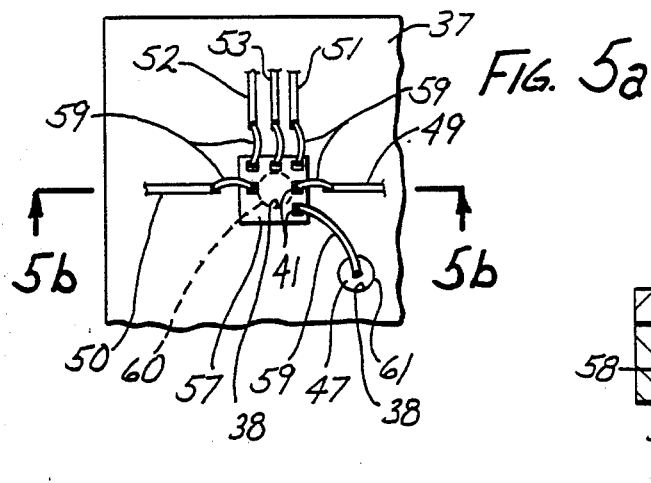
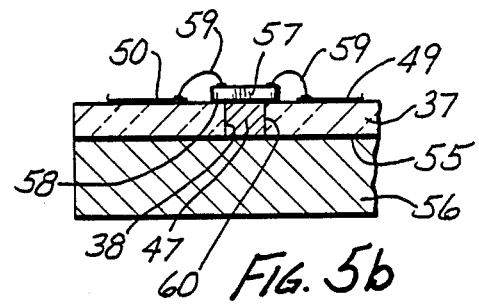
FIG. 5a
FIG. 5b
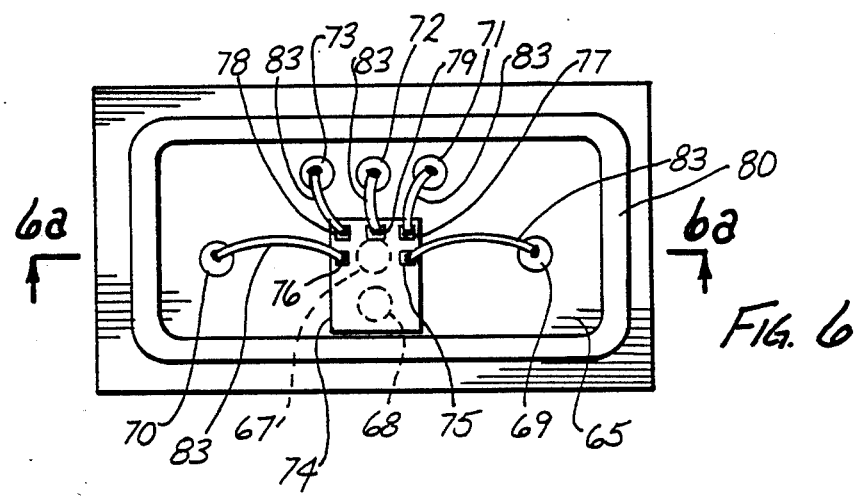
FIG. 6
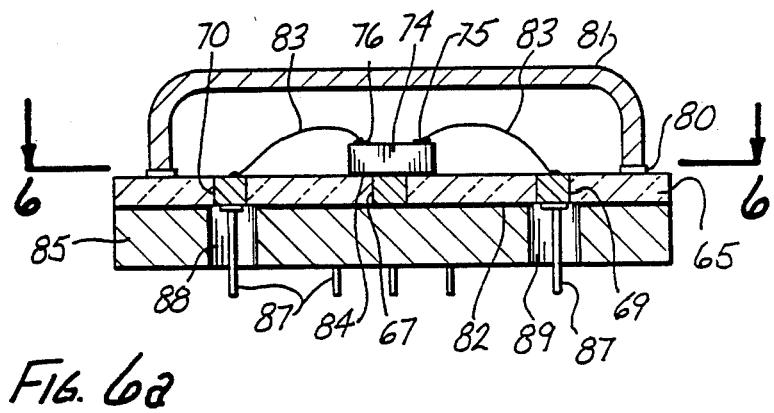
FIG. 6a

CERAMIC SUBSTRATE WITH METAL FILLED VIA HOLES FOR HYBRID MICROCIRCUITS AND METHOD OF MAKING THE SAME

BACKGROUND OF THE INVENTION

This invention relates to microcircuits and more particularly to a ceramic substrate provided with metal filled via holes for use in constructing hybrid microcircuits for microwave systems.

Microwave components that operate at frequencies on the order of gigahertz are preferably made of (gallium arsenide) GaAs semiconductor material because of the high mobility of electrons in the material. Moreover, because such microwave components are operating with band waves that are on the order of millimeters and centimeters in length, and the conducting paths of microcircuits are generally of the same order in length, the mechanical construction and the electrical performance of microwave circuits are closely interrelated. Thus, in hybrid microwave circuits, the conductive paths provided for connecting the components of the circuit to ground are not just paths of minimal significance but must be viewed as circuit elements themselves in that they provide distributed inductance depending on their length which must be taken into consideration. Moreover, because of the gigahertz frequency at which components of microwave circuits operate they generate a large amount of internal heat which must be carried away to enable the circuits to perform properly.

SUMMARY OF THE INVENTION

In accordance with the present invention, a ceramic substrate for making a hybrid microcircuit is provided on the surface thereof with a large number of small via holes, each on the order of 0.013 of an inch in diameter. A composite formed of a mixture of a refractory metal and a lower melting metal having a good electrical and thermal conductivity is provided in each of the via holes. Microwave components such as GaAs dies and other electronic components of a hybrid microcircuit are mounted on the surface of the ceramic substrate over the metal filled via holes thereby using the metal fillings therein for ground connections and for carrying away heat internally generated within the components.

The process for placing the composite metal filling in each of the via holes of the ceramic substrate is performed by providing a first paste composed of particles of a refractory metal and a binder which is deposited in each of the via holes. The ceramic substrate is then placed in a furnace and sintered in a reducing atmosphere to provide a porous mass of the refractory metal in each of the via holes. Then a second paste composed of particles of a lower melting metal and a binder is deposited above the porous mass of metal in each of the via holes. The ceramic substrate is then placed in a reflow furnace and heated in a reducing atmosphere to form a molten mass of the lower melting metal which infiltrates into the pores of the porous mass of refractory metal to form a solid composite metal mixture. The percentage mixture by volume of each of the metals that forms the composite metal is chosen by controlling the amount of binder in the first paste containing the refractory metal particles which upon burning off determines the amount of the molten lower melting metal that can be drawn by surface tension into the porous sintered refractory metal to form the composite metal. In this way, the composite metal can be constructed to have a thermal coefficient of expansion that is substantially of the same order as the thermal coefficient of expansion of the semiconductor material used in the microwave components to be mounted on the metal filled via holes and also that of the material used for the ceramic substrate. Moreover, the infiltration of the lower melting metal into the pores of the sintered refractory metal results in the via holes being hermetically sealed.

Accordingly, one of the objects of the present invention is to provide metal filled via holes on a ceramic substrate for use in grounding and transferring internally generated heat away from discrete electronic components that are mounted on the surface of the substrate over the metal filled via holes to form a hybrid microcircuit.

Another object of the present invention is to provide a novel process for forming composite metal filled via holes on a ceramic substrate for use in grounding and transferring heat away from microwave components that are being mounted on the surface of the ceramic substrate to form a hybrid microcircuit.

Another object of the present invention is to provide for mounting microwave components on metal filled via holes provided on a ceramic substrate to thereby provide a short path to ground for each of these components and thereby minimize noise in the microwave circuit provided on the surface of the substrate.

Another object of the present invention is to provide metal filled via holes for use in mounting high frequency components on a ceramic substrate while providing for hermetically sealing the via holes.

Another object of the present invention is to provide metal filled holes on a ceramic substrate having a hybrid microcircuit on the surface thereof whereby the metal filled via holes are used for transferring signals to and from the hybrid microcircuit when a metal cover is placed over the ceramic substrate to shield the hybrid microcircuit thereon from outside interference.

Still another object of the present invention is to provide a novel process for forming metal filled via holes on a ceramic substrate which provides for effectively matching the thermal coefficient of expansion of the metal filling in the via holes with that of the material of the circuit components to be mounted thereover and also the material of the ceramic substrate.

Other objects and features of the invention will become apparent to those skilled in the art as the disclosure is made in the following detailed description of a preferred embodiment of the present invention as illustrated in the accompanying sheets of drawings.

BRIEF DESCRIPTION OF THE DRAWINGS

FIG. 1 is a plan view illustrating one way provided in the prior art for mounting a GaAs die on an alumina substrate;

FIG. 1a is a sectional view taken in FIG. 1 along line 1a—1a in the direction of the arrows;

FIG. 1b is a sectional view taken in FIG. 1 along line 1b—1b, in the direction of the arrows;

FIG. 2 is a perspective view illustrating another way provided in the prior art for mounting a GaAs die directly on a heat sink;

FIG. 2a is a sectional view taken in FIG. 2 along line 2a—2a in the direction of the arrows;

FIG. 3 is a plan view of a typical square sheet of alumina substrate for use in the present invention showing the large number of small via holes drilled through the body thereof;

FIG. 3a is a side view of the alumina substrate shown in FIG. 3;

FIG. 5a is a plan view of the portion of the alumina substrate in FIG. 5 showing the GaAs die mounted over the metal filled via hole with its top ground terminal connected by a ribbon lead to an adjacent metal filled via hole provided on the alumina substrate;

FIG. 5b is a sectional view taken in FIG. 5a along lines 5b—5b in the direction of the arrows;

FIG. 6 is a plan view showing how the top terminals for a GaAs die mounted on an alumina substrate can use metal filled via holes on the substrate to provide external connections therefor; and FIG. 6a shows a sectional view taken in FIG. 6 along line 6a—6a in the direction of the arrows and includes the showing of a metal cover for the hybrid component mounted on the alumina substrate.

DESCRIPTION OF THE PREFERRED EMBODIMENT

Figure 4A:
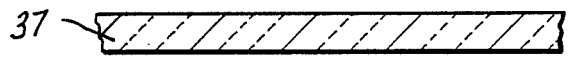
FIGS. 4a–4g are cross sections of a portion of the alumina substrate in FIG. 3 showing the successive steps of the process for providing the composite metal filling in the via holes thereon.

Referring to the drawings, FIG. 1 is an enlarged plan view illustrating one way in the prior art of mounting a GaAs die 10 for a hybrid microwave circuit by brazing the primary ground 11 on the bottom of the GaAs die on the top surface of a ceramic substrate 12. The substrate 12, only a portion of which is shown, is a 2 by 2 inch square sheet of alumina about 0.03 inch thick. As shown in FIG. 1a, the substrate 12 has a thin-film ground plane 22 on the bottom thereof which is attached to the top of a (copper/tungsten) Cu/W block 20 that is about 0.10 inch thick. The top surface of alumina substrate 12 is provided with a pattern of thin-film conductive paths 13 to 19, inclusive, for interconnecting terminals on the GaAs die 10 to other components of the microcircuit and for grounding the GaAs die. Thus, the pattern of conductive paths of the microcircuit typically includes an RF input path 13, an RF output path 14, a drain path 15, an emitter path 16, a bias path 17, and ground paths 18 and 19. As shown, each of the thin-film conductive paths 13 to 18, inclusive, has one end thereof connected by a ribbon or wire lead 21 to one of the terminals provided on the top of the GaAs die 10 and the thin-film conductive path 19 has one end thereof (FIG. 1b) connected to the primary ground on the bottom of the GaAs die 10. As shown in FIG. 1a, the ground path 18 which has one end connected to ground terminal 18a on the top of GaAs die 10 extends to and wraps around the edge of the alumina substrate 12 and connects to the ground plane 22 thereof. As shown in FIG. 1b, ground path 19 which has one end connected to the primary ground 11 on the bottom of the GaAs die 10 similarly extends to and wraps around the edge of alumina substrate 12 and connects to the ground plane 22 thereof.

It should be evident that since the GaAs die 10 and the other electronic components mounted on the alumina substrate 12 are each typically on the order of 0.09 to 0.013 inch square, and the interconnecting and ground paths of the thin-film conductive pattern are spaced as closely together as possible, a large number of such components and their conductive paths are provided on the surface of the 2 by 2 inch square sheet of alumina substrate 12.

The disadvantage of the approach shown in FIG. 1 for mounting GaAs dies on the alumina substrate 12 is that some of the terminals and primary ground wraparound paths for the GaAs dice are quite long since each of them has to extend from whatever location a particular GaAs die or active electronic component may have on the surface of the alumina substrate to the edge thereof. Consequently, the distributed inductance of such long wraparound ground paths is high. This affects the operation of the microcircuit on the alumina substrate by causing excessive ground noise which results in poor performance of the microcircuit at high frequencies. Moreover, because of the large number of wraparound paths needed on the alumina substrate, these ground paths take up a lot of space on the surface of the substrate which increases the size of the substrate required to construct a particular hybrid microcircuit. Moreover, it is a very expensive process to provide for extending the wraparound paths about the edges of the alumina substrate so as to contact the ground plane thereof. Still further, the internal heat generated by each GaAs die or other high frequency component has to be carried away by first conducting through the alumina substrate which is a poor thermal conductor, prior to being dissipated in the heat sink 20. In other words, the transfer of heat from the microcircuit is not very efficient.

FIG. 2 is a perspective view of an alternate prior art manner of mounting a GaAs die 23 and connecting the terminals on the top thereof to the thin-film conducting paths provided on the surface of an alumina substrate 24. This construction provides, for example, for the alumina substrate 24, having a central rectangular opening 25, to be attached by its bottom ground plane 34 on the top of a Cu/W block 31 which serves as a heat sink. Other forms of this manner of mounting GaAs dies include the provision of attaching spaced strips of alumina substrate on the heat sink. As shown in FIG. 2 and 2a, the GaAs die 23 is brazed with its primary ground 32 on the bottom thereof contacting the top surface of the Cu/W block 31 within the central rectangular opening 25 of the alumina substrate 24. The thin-film conductive pattern provided on the top surface of alumina substrate 24 includes an RF input path 26, RF output path 27, a drain path 28, an emitter path 29, and a bias path 30. Each of these conductive paths is connected by a ribbon lead 33 to one of the terminals provided on the top of GaAs die 23.

Although in FIG. 2, the mounting of the GaAs die 23 directly onto the surface of Cu/W block 31 has the advantage of providing a direct heat sink for GaAs die 23 and a direct ground connection for the primary ground 32 on the bottom of the GaAs die 23, the additional ground terminal 35 located on the top surface of the GaAs die 23 must be connected by a ribbon lead 33 to ground by way of the thin-film wrap-around path 36. The reason for this is because it is not possible to connect the top ground terminal 35 by use of a ribbon lead 33 to the top surface of Cu/W block 31 because the heat needed for the brazing of the end of the ribbon lead is quickly dissipated in the large mass of metal forming Cu/W block 31 requiring that extremely high temperatures be used which burns up the contact. Hence such an additional ground connection for a terminal on the top of GaAs die 23 requires that a wraparound ground path 36 still needs to be provided on the surface of the substrate 24 which extends to the edge of and wraps around to connect to the ground plane 34 thereof, as shown in FIG. 2a.

Reference will next be made to FIG. 3 which shows an alumina substrate 37 as provided for the present invention. The substrate which is made of alumina having a purity of about 96 to 99.6% is a 2 by 2 inch square sheet provided with a thickness t (FIG. 3a) of about 0.030 inch. The blank of starting alumina substrate 37 is already in its fired state when the large number of via holes 38, each on the order of 0.010–0.030 of an inch in diameter, is drilled in precisely specified locations on the surface thereof by use of a computer controlled laser. The locations on the surface of the alumina substrate 37 for the via holes 38, which may include as many as 400 or more in number, are predetermined by the specified desired placement of each of the discrete GaAs dies and other active electronic components relative to the thin-film conductive paths and passive components to be included in a high density hybrid microcircuit to be fabricated on the surface of the alumina substrate. Accordingly, it is necessary to drill each via hole 38 with respect to the others on the alumina substrate 37 within a tolerance of one thousandths of an inch. This is needed to make sure that each GaAs die, or any other component of the hybrid microcircuit that needs a path to ground and/or needs its heat to be carried away, can be properly mounted above one or more of the metal filled via holes 38 on the alumina substrate 37 in a position so that its terminals can be connected to appropriate ones of the thin-film conducting paths to be subsequently provided on the surface of the alumina substrate 37.

A detailed disclosure of the steps of the process used for providing the metal filled via holes on the alumina substrate 37 of the present invention for use in mounting the GaAs dies and other microwave components will next be presented by reference to FIGS. 4a–4g.

Figure 4B:
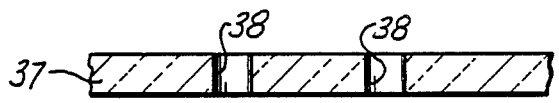
Figure 4C:
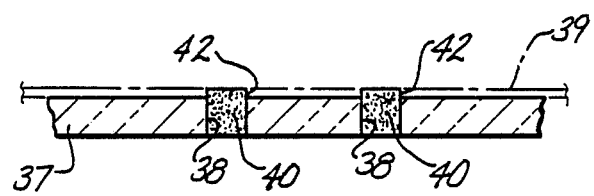

Thus, FIG. 4a illustrates a portion of the 2 by 2 inch square sheet of as-fired alumina substrate 37, which is about 0.030 inch thick, that is selected as the starting material. In FIG. 4b, two via holes 38, each on the order of 0.013 inch in diameter, that are included in the pattern of via holes shown in FIG. 3, for example, are shown drilled in the portion of the alumina substrate 37 by use of a numerically controlled laser with an accuracy that is within one thousandths of an inch of its specified location relative to the other via holes on the alumina substrate. As shown in FIG. 4c, a stencil 39, indicated by dashed lines, which is about 2 mils thick and has a pattern of holes thereon identical to the pattern of via holes 38 that is drilled on the alumina substrate 37, is placed over the upper surface of alumina substrate 37, with their holes aligned. A first paste 40 made of tungsten particles and a binder is then squeegeed, i.e., pressed, through the holes of stencil 39 so as to fill all the via holes 38 on the alumina substrate 37 (FIG. 3).

As evident by the showing in FIG. 4c, upon removal of stencil 39, a small protrusion 42 of the tungsten paste 40 equal to the thickness of the stencil 39, extends above each of the via holes 38 provided on the alumina substrate 37.

Figure 4D:
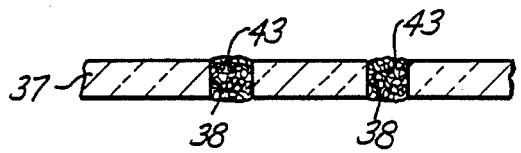

Alumina substrate 37 with the tungsten paste 40 in each of the via holes 38 thereof is then sintered at about 1375° C. for about 15 to 20 minutes in a furnace having a controlled reducing atmosphere comprised preferably of a mixture of hydrogen and nitrogen to cause the binder in the paste 40 to burn out and leave a porous mass 43 of sintered tungsten in each of the via holes 38, as shown in FIG. 4d. Note that the small protrusion 42 of tungsten paste 40 above each via hole in FIG. 4c is reduced due to the shrinkage of the tungsten paste 40 caused by the burn out of its binder during the sintering. It should be especially noted that the amount of the binder chosen to be in the tungsten paste, upon being burned out, results in the sintered tungsten 43 having about a 15% porosity. It should be also noted that by increasing or decreasing the amount of binder in the tungsten paste, the porosity of the sintered tungsten can be controlled to vary from between 10% to 20%.

It should be further noted that the alumina substrate with the tungsten paste in the via holes 38 can be sintered in a furnace at a temperature varying between 1175° C. and 1575° C. depending on the size of the tungsten particles used in the paste, the thickness of the alumina substrate and the time allotted for the sintering to take place.

Figure 4E:
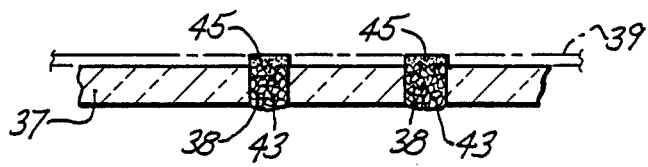
Figure 4F:
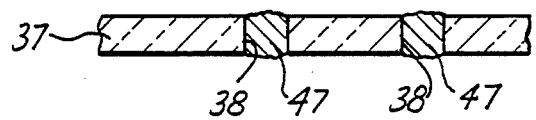

As shown in FIG. 4e, the stencil 39, is again placed over the alumina substrate 37 with its holes aligned with the via holes 38 thereof. Then, a second, paste 45 made of copper particles with a binder is squeeged, i.e. pressed, into all of the holes of the stencil 39 so as to lie on the top of the porous mass of sintered tungsten 43 in each of the via holes 38. It should be noted that particles of a metal such high thermal and electrical conductivity and a relatively low melting point. Thus, upon now heating the alumina substrate 37 to about 1150° C. for about 10 minutes in a reflow furnace having a controlled atmosphere comprised of a mixture of hydrogen and nitrogen, the binder of the copper paste 45 is burned out and the copper particles are heated to a molten state which enables the copper to be infiltrated, i.e., effectively drawn by surface tension into the pores of the tungsten mass 43. As a result, the mixture of metals in each via hole 38 ends up, as shown in FIG. 4f, in the form of a solid composite metal mass 47 comprised of a mixture by volume of about 85% tungsten and 15% copper.

It should be noted that the copper paste 45 can be reflowed into the porous tungsten at a temperature varying between 1050° C. and 1250° C. dependent on the size of the copper particles and the time allotted for the reflow to take place.

Figure 4G:
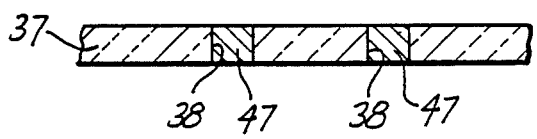

As shown in FIG. 4g, after the composite mixture of tungsten and copper is formed in each of the via holes 38, the top and bottom surfaces of the alumina substrate 37 are then lapped and polished to eliminate any excess of the solid mass 47 of the metal (See FIG. 4f) that may be present on the top or bottom of the via holes 38.

In view of the above, it should now be clearly evident that the use of an unfired alumina as the starting material for the ceramic substrate 37 would be impractical because it is not possible to maintain the dimensions and required tolerance of the pattern of via holes drilled thereon due to the shrinkage of such unfired alumina during the subsequent heating steps needed, as above described, to form the metal filling in the via holes 38.

Upon the completion of the filling of metal in the via holes 38 on the alumina substrate and the subsequent lapping and polishing of the upper and lower surfaces of the alumina substrate, each of these surfaces is then metallized in a well known manner by applying successive thin-films of, for example, titanium and tungsten thereon followed by the deposition of a gold film over the tungsten film. The upper thin-film surface of the alumina substrate 37 is then processed in a well known manner using photolithographic techniques to provide a desired thin-film pattern of closely spaced conductive paths thereon as needed for a particular hybrid microcircuit being fabricated on the upper surface of the alumina substrate. The thin films that have been provided on the bottom surface of the alumina substrate form the ground plane therefor.

Figure 5:
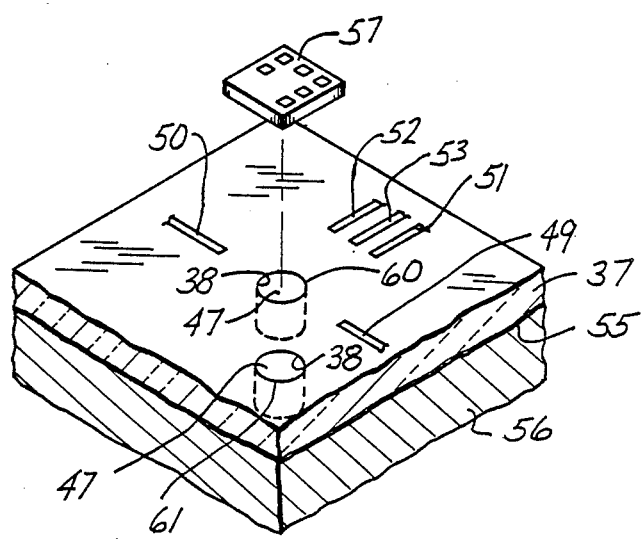
FIG. 5 is a perspective view showing a GaAs die exploded away from a metal filled via hole provided on a corner portion of the alumina substrate in FIG. 3 that has thin film circuit paths on the upper surface thereof and a thin film ground plane on the lower surface thereof.

Reference will next be made to FIG. 5 which shows a perspective view of a corner portion of the alumina substrate 37 (FIG. 3) provided with two of the via holes 38 filled with a solid mass 47 of tungsten and copper so as to provide metal filled via holes 60 and 61. FIG. 5 also shows the conductive paths that have been provided on the surface of the corner portion of the alumina substrate 37. These conductive paths include an RF input path 49, an RF output path 50, a drain path 51, an emitter path 52, and a bias path 53. It should be further noted in FIG. 5 that the alumina substrate 37 is attached by its ground plane 55 to a Cu/W block 56 which serves as a heat sink and a GaAs die 57 is shown exploded away from the top of the metal filled via hole 60.

Reference will next be made to FIGS. 5a and 5b which show the GaAs die 57 mounted with its bottom primary ground 58 brazed over the metal via hole 60 on the corner portion of the alumina substrate 37. Short ribbon leads 59 are used to attach the appropriate terminals on the top of the GaAs die 57 to the RF input path 49, the RF output path 50, the drain path 51, the emitter path 52 and the bias path 53.

It should be especially noted that the GaAs die 57 is shown with an additional ground terminal 41 on the top thereof which is connected by a ribbon lead 59 to the other metal filled via hole 61 provided on the corner portion of the alumina substrate 37. Such a connection for the ground terminal of GaAs die 57 can be made because the small mass of the metal fill 47 in the via hole 61 enables it to be readily heated up to the desired temperature needed to braze the end of the ribbon lead 59 thereto. It should be evident, of course, that in FIG. 5a a thin-film conductive path could be provided on the surface of the alumina substrate 37 which has one end thereof connected to the metal fill 47 in the via hole 61 and a ribbon lead could provide for connecting the other end of this conductive path to the ground terminal 41 on the top of the GaAs die 57.

Thus, the approach used in the present invention of using metal filled via holes on an alumina substrate for connecting not only the bottom primary ground plane of a GaAs die but also an additional ground terminal on the top of the GaAs die to the ground plane of the alumina substrate clearly provides for eliminating the need for any thin-film wraparound paths for ground connections on the top surface of the alumina substrate. Hence the use of metal filled via holes on a ceramic substrate provides for improving the performance of high frequency hybrid microcircuits by minimizing the high inductance problems created by the long thin-film wraparound ground paths presently being used. Moreover, the metal fill for a via hole also provides a short effective thermal path for carrying the internal heat generated by a high frequency component attached on the top of the ceramic substrate to the Cu/W block serving as a heat sink. Still further, the eliminating of the need to provide space on the top of the alumina substrate for thin-film wraparound ground paths, and the efficient transferring of heat away from each of the high frequency components enables these components to be more closely positioned, thereby enabling package miniaturization.

As previously mentioned the amount of binder used in making the tungsten paste that is placed in each of the via holes 38 (FIG. 4c) can be chosen so as to control the volume void or porosity of the sintered tungsten in the via holes and therefore the amount of copper that can reflow into the pores thereof. In this way, the resulting composition of the metal mixture in the via holes can be made to vary to include 80 to 90% tungsten and a remainder of 20 to 10% copper, by volume, as needed to provide a particular metal composition that has a thermal coefficient of expansion that approximately matches that of the GaAs semiconductor material. This is important because a GaAs die consists of piezoelectric crystals which upon being stressed generate a varying minute alternating electrical voltage dependent on the pressure upon the crystalline material. Thus, when the alumina substrate is subjected to temperature variations of between $-55°$ C. to $+300°$ C. as specified in military standards 883, for example, the stresses induced in a GaAs die by substantial differences in the thermal coefficient of expansion of GaAs material and the metal fill in the via holes on which the GaAs die is mounted can have an affect on the performance of the hybrid microcircuit.

Thus, since GaAs has a thermal coefficient of expansion of $57 \times 10^{-7}$ in/in/°C., the amount of binder in the first paste of tungsten particles has been chosen to provide a metal fill in the via holes of 85% tungsten and 15% copper by volume to thereby provide a metal composition having a thermal coefficient of expansion of approximately $57 \times 10^{-7}$ in/in/°C.

The thermal coefficient of expansion of the metal fill in the via holes must also be compatible with that of the material used for the ceramic substrate. Thus, when alumina is used which has a thermal coefficient of expansion of about $67 \times 10^{-7}$ in/in/°C., it has been found that the thermal coefficient of expansion of about $57 \times 10^{-7}$ in/in/°C. provided by the metal composition comprising 85% tungsten and 15% copper by volume is sufficiently close enough in order of magnitude to that of the alumina so that when the alumina substrate is subjected to heating ranges as specified by military standards 883 the metal fill of the via holes will not be induced to bulge out of the via holes and the alumina substrate will not be induced to crack.

It should be further noted that the Cu/W metal fill for the via holes is inherently made hermetic by the copper reflow step which serves to close all the pores of the sintered tungsten mass. This is advantageous since when the photoresist or any other solvents are applied on the alumina substrate during the forming of the pattern of conductive paths on the surface thereof, for example, it is important that these solvents not enter into and get trapped in any voids, pores or cracks of the metal fill in the via holes. Such solvents could tend to find their way out of the metal filled via holes later in the life of the hybrid microcircuit and could cause the ceramic substrate and/or the circuit components thereon to corrode or otherwise deteriorate and fail.

It should now be clearly understood that the procedures of the present invention allow the ceramic substrate to be made of a material other than alumina, such as aluminum nitride, for example. Further, the procedures of the present invention permit a mixture of a number of other different metals to be used as the metal fill for the via holes while readily enabling matching of the thermal coefficient of expansion of the metal fill for the via holes with the material of the circuit components mounted thereon and the material of the ceramic substrate used. Thus a refractory metal such as molybdenum can be substituted for tungsten and other thermally and electrically conductive metals like Ag and Au, alone or in combination, can be substituted for the copper. In particular, the other mixtures of composite metals that could be provided to fill the via holes 38 include Ag-Au/W, Au/W, Ag/W, Ag/Mo, Cu/Mo, Au/Mo, etc.

Reference will next be made to FIGS. 6 and 6a which show another way of using the metal filled via holes provided on an alumina ceramic substrate in accordance with the present invention. Here, an alumina substrate 65, having a ground plane 82 on the bottom thereof, is shown provided with seven composite metal filled via holes 67, 68, 69, 70, 71, 72 and 73. The closely spaced metal filled via holes 67 and 68 on substrate 65 have mounted over the tops thereof a single GaAs die 74 which provides a simplified hybrid microcircuit. It should be noted that the GaAs die 74 has a primary ground 84 on the bottom thereof which directly contacts the metal fill in both the via holes 67 and 68 and that the bottoms of the metal fills in these via holes are in contact with the ground plane 82 on the bottom of the alumina substrate 65. The use of two metal filled via holes such as 67 and 68 is needed when a GaAs die, such as die 74, generates heat faster than a single metal fill via hole can carry it away.

The remaining five metal filled via holes 69–73 shown in FIG. 6 are being used to provide for connection of terminals provided on the top of the GaAs die 74 to external circuits (not shown). It should be noted that the ground plane 82 on the bottom of alumina substrate 65 has enlarged holes about each of the five remaining metal filled via holes 69–73 to ensure that the metal fill of these via holes do not contact the ground plane 82.

As shown in FIG. 6, the metal filled via hole 69 is connected by a ribbon lead 83 to the RF input terminal 75, the metal filled via hole 70 is connected by a ribbon lead 83 to the RF output terminal 76, the metal filled via hole 71 is connected by a ribbon lead 83 to the emitter terminal 77, the metal filled via hole 72 is connected by a ribbon lead 83 to the bias terminal 79, and the metal filled via hole 73 is connected by a ribbon lead 83 to the drain terminal 78. The alumina substrate 65 has a rectangularly configured thin-film metal pad 80 deposited about the border of its upper surface, as shown in FIG. 6. As shown in FIG. 6a, a metallic cover 81, made of Kovar, for example, is placed over the alumina substrate 65 with its bottom sealed to the metal pad 80 so as to enclose the hybrid microwave circuit on the surface thereof. The metallic cover 81 provides for shielding the hybrid microcircuit from outside interference. As shown in FIG. 6a, a pin 87 is brazed on the bottom of each of the metal filled via holes 69–73 on the alumina substrate 65. These pins 87 are used for providing external connections for the terminals on the top of the GaAs die 74. A Cu/W block 85 which serves as a heat sink is provided with five oversize through holes which are aligned with five metal filled via holes 69, 70, 71, 72, and 73 on the alumina substrate. Two of the oversize holes 88 and 89 are seen in the sectional view of the alumina substrate 65 shown in FIG. 6a. Thus, when the bottom of alumina substrate 65 is attached on the top of the Cu/W block 85, the pins 87 on the bottom of each of the metal filled via holes 69–73 extend down through and protrude below the respective oversized through holes in Cu/W block 85. Thus, it is because the metal filled via holes 38 are hermetically sealed that they offer a simple and convenient way of making the necessary external connections for the terminals of the electronic components of hybrid microwave circuit on the substrate 65.

It should be appreciated that the showing in FIGS. 6 and 6a of a single GaAs die 74 as a hybrid microcircuit on the alumina substrate 65 is merely for illustrative purposes. More typically, several such GaAs dies, as well as other electronic components would be provided on the surface of the alumina substrate. Moreover, common terminals of several of these GaAs dies, for example, may be connected to the same metal filled via holes being used as external connectors.

While the present invention has been described specifically in at least one of its forms, such detailed disclosure has been made only in order to comply with the patent laws and is not intended in any way to limit the concept or scope of the invention, which is more particularly defined in the accompanying claims.

What is claimed is:

1. A substrate for a hybrid microcircuit including electronic components, said substrate comprising:
   a thin sheet of dimensionally stable electrically insulating material having an upper and lower surface;
   a plurality of via holes provided on the upper surface of and extending through the sheet of electrically insulating material; and
   a metal filling in each of said via holes, said metal filling comprising a porous mass of sintered refractory metal having a low melting point conductive metal reflowed into the porous mass thereof;
   whereby the electronic components of said hybrid microcircuit are mounted over selected ones of the via holes on the upper surface of said sheet of electrically insulating material and use the metal fillings therein to provide a ground connection for and to carry internally generated heat away from the electronic components.

2. A substrate for a hybrid microcircuit as defined in claim 1 wherein said plurality of via holes are approximately 0.010 to 0.030 inch in diameter.

3. A substrate for a hybrid microcircuit as defined in claim 1 wherein said sheet of electrically insulating material is made of alumina having a purity of 96% to 99.6%.

4. A substrate for a hybrid microcircuit as defined in claim 1 wherein said sheet of electrically insulating material has a thickness of approximately 0.030 inch.

5. A substrate for a hybrid microcircuit as defined in claim 1 wherein said sheet of electrically insulating material has up to 100 or more via holes drilled on each square inch of the upper surface thereof.

6. A substrate for a hybrid microcircuit as defined in claim 1 including terminals for external circuits on said electronic components, said terminals being connected by ribbon leads to the metal fillings in selected ones of the via holes.

7. A substrate for a hybrid microcircuit as defined in claim 1 including ground terminals on said electronic components, said ground terminals being connected by ribbon leads to the metal fillings in selected ones of the via holes.

8. A substrate for a hybrid microcircuit as defined in claim 1 wherein said electronic components are GaAs dies.

9. A substrate for a hybrid microcircuit as defined in claim 1 wherein said hybrid microcircuit is for a microwave system operating at a gigahertz frequency.

10. A composite metal for filling via holes provided on a sheet of dimensionally stable electrically insulating material for mounting electronic components formed of semiconductor material, said composite metal comprising a mixture of a porous mass of refractory metal and an electrically and thermally conducting low melting point metal reflowed into the porous mass of refractory metal such that the via holes are filled with a solid mass of the composite metal thereby making the via holes hermetic.

11. A composite metal for filling via holes provided on a sheet of dimensionally stable electrically insulating material for mounting electronic components formed of semiconductor material as defined in claim 10 wherein said composite metal is characterized as having a coefficient of thermal expansion that is compatible with that of the semiconductor material and the electrically insulating material.

12. A composite metal for filling via holes provided on a sheet of dimensionally stable electrically insulating material for mounting electronic components formed of semiconductor material as defined in claim 10 wherein said composite metal provides for hermetically sealing the ends of the via holes.

13. A composite metal for filling via holes provided on a sheet of dimensionally stable electrically insulating material for mounting electronic components formed of semiconductor material as defined in claim 10 wherein said composite metal is formed by filling each of the via holes on the sheet of electrically insulating material with a first paste comprised of particles of a refractory metal and a binder, heating the sheet of electrically insulating material to burn off said binder in the first paste and sintering said particles of refractory metal to form a porous mass of the refractory metal in each of said via holes, placing a second paste comprised of particles of a conductive low melting point metal and a binder on the top of the porous mass of the refractory metal in each of the via holes, and heating the sheet of electrically insulating material to burn off said binder in said second paste and convert the particles of the low melting point metal into a molten mass which infiltrates into the porous mass of the refractory metal to form a solid mass of composite metal in each of the via holes.

14. A composite metal for filling via holes provided on a sheet of dimensionally stable electrically insulating material for mounting electronic components formed of semiconductor material as defined in claim 10 wherein said refractory metal is tungsten and said low melting point metal is copper.

15. A composition of metal for filling each of a plurality of via holes on a dimensionally stable electrically insulating substrate on which high frequency semiconductor components of a hybrid microcircuit are mounted, said composition comprised of a first and second powdered metal each formulated with a binder to provide a first and second paste, respectively, the first paste being charged into said via holes and heat treated to form a sintered porous mass of said first powdered metal and the second paste being placed over the top of the porous mass in each of the via holes and heat treated to form a molten mass of said second powdered metal which reflows into the porous mass of the first powdered metal to provide a solid mass of composite metal in each of the via holes.

16. A composite metal for filling via holes provided on a sheet of dimensionally stable electrically insulating material for mounting electronic components formed of semiconductor material as defined in claim 13 wherein the first paste is formulated of tungsten particles with an amount of binder such that when the binder is burned off and the tungsten particles are sintered a porous mass of tungsten is formed which fills approximately 85% of the volume of the via holes and wherein the second paste is formulated of copper particles which when melted and reflowed into the porous mass of tungsten fill the remaining approximately 15% of the volume of the via holes to form the solid mass of composite metal in each of the via holes.

17. A composite metal for filling via holes provided on a sheet of dimensionally stable electrically insulating material for mounting electronic components formed of semiconductor material as defined in claim 16 wherein said semiconductor material is GaAs and said composite metal has a thermal coefficient of expansion of approximately $57 \times 10^{-7}$ in/in/°C.

18. In a method for manufacturing a carrier with a plurality of metal filled via holes for use in fabricating a hybrid microcircuit including electronic components, said method comprising the steps of:
providing a dimensionally stable electrically insulating substrate having an upper and lower surface;
drilling a pattern of precisely positioned via holes in said substrate;
forming a first paste from particles of a refractory metal and a binder;
depositing said first paste into each of said via holes;
sintering said first paste to provide a porous mass of the refractory metal in each of said via holes;
forming a second paste from particles of a conductive metal having a low melting point and a binder;
depositing said second paste over the porous mass of refractory metal in each of said via holes;
heating said second paste so that the metal particles thereof are in a molten state which infiltrates into the pores of the porous mass of said refractory metal to fill each of said via holes with a solid mass of metal; and
lapping and polishing the upper and lower surfaces of said substrate to remove excess metal on the via holes and thereby make said surfaces planar.

19. In a method for manufacturing a ceramic substrate with a plurality of metal filled via holes for use in fabricating a hybrid microcircuit, said method comprising the steps of:
providing a sheet of as-fired ceramic substrate having upper and lower surfaces;
drilling a pattern of precisely positioned via holes in said ceramic substrate by use of a laser;
providing a stencil having the same pattern of holes thereon as the pattern of via holes on said sheet of ceramic substrate;
placing said stencil over said sheet of ceramic substrate with its pattern of holes aligned with the pattern of via holes thereon;

forming a first paste from a binder and particles of a refractory metal selected from the group consisting of tungsten and molybdenum;

depositing said first paste into the via holes by forcing the first paste through the holes of said stencil thereby leaving an excess of said first paste on the top of each said via holes;

placing said sheet of ceramic substrate in a furnace and sintering it in a reducing atmosphere to provide a porous mass of the refractory metal in each of said via holes;

forming a second paste from a binder and particles of a high conductive metal having a low melting point selected from the group consisting of copper, gold and silver and alloys of gold and silver;

again placing said stencil over said sheet of ceramic substrate with its pattern of holes aligned with the pattern of via holes thereon;

depositing said second paste in the holes of the stencil over the porous mass of sintered refractory metal in each of said via holes;

placing said sheet of ceramic substrate in a reflow furnace having a reducing atmosphere and heating said second paste to bring said particles of high conductive metal having a low melting point to a molten state which infiltrates into the porous mass of said refractory metal to fill each of said via holes with a solid mass of composite metal; and lapping and polishing the upper and lower surfaces of said sheet of ceramic substrate to remove excess metal on the top and bottom of the via holes and thereby make said surfaces planar.

20. In a method for manufacturing a carrier as defined in claim 18 including the step of:

selecting the amount of binder used in making the first paste so as to control the volume of the porosity of the sintered refractory metal in the via holes and therefore the volume amount of the conductive metal that infiltrates into the pores of the porous mass of refractory metal;

whereby the thermal coefficient of expansion of the solid mass of metal in each of the via holes can be controlled to be in the range of the thermal coefficient of expansion of the substrate and the electronic components mounted above the metal filled via holes.

21. In a method for manufacturing a carrier as defined in claim 18 including the steps of:

depositing a selective conductive pattern on the upper surface of the substrate; and depositing a ground plane on the lower surface of the substrate.

22. In a method for manufacturing a carrier as defined in claim 21 including the step of mounting the substrate with its ground plane brazed to a heat sink formed of a block of conductive material.

* * * * *